US012276703B2

(12) United States Patent
Biller

(10) Patent No.: US 12,276,703 B2
(45) Date of Patent: Apr. 15, 2025

(54) NON-DESTRUCTIVE EVALUATION OF LITHIUM-ION BATTERIES

(71) Applicant: TDA Research, Inc, Wheat Ridge, CO (US)

(72) Inventor: Joshua R. Biller, Evergreen, CO (US)

(73) Assignee: TDA Research, Inc., Golden, CO (US)

( * ) Notice: Subject to any disclaimer, the term of this patent is extended or adjusted under 35 U.S.C. 154(b) by 126 days.

(21) Appl. No.: 18/144,122

(22) Filed: May 5, 2023

(65) Prior Publication Data

US 2023/0358821 A1 Nov. 9, 2023

Related U.S. Application Data

(60) Provisional application No. 63/338,710, filed on May 5, 2022.

(51) Int. Cl.
*G01R 31/392* (2019.01)
*G01N 27/82* (2006.01)
*G01R 31/382* (2019.01)

(52) U.S. Cl.
CPC .......... *G01R 31/392* (2019.01); *G01N 27/82* (2013.01); *G01R 31/382* (2019.01)

(58) Field of Classification Search
None
See application file for complete search history.

(56) References Cited

U.S. PATENT DOCUMENTS

| | | |
|---|---|---|
| 8,198,684 B2 | 6/2012 | Koch |
| 11,598,824 B2 | 3/2023 | Motz |
| 11,619,686 B2 | 4/2023 | Uchida |
| 2018/0180679 A1 | 6/2018 | Lee |
| 2021/0103013 A1* | 4/2021 | Jono ...................... H10N 50/10 |
| 2021/0104785 A1* | 4/2021 | Willey .................. H01M 4/386 |
| 2022/0229119 A1* | 7/2022 | Jerschow ............. G01R 33/025 |
| 2022/0347402 A1 | 11/2022 | Kendall |
| 2022/0349943 A1 | 11/2022 | Mima |
| 2022/0357402 A1* | 11/2022 | Kendall ............ H01M 10/4285 |

OTHER PUBLICATIONS

Yinan Hu Sensitive "Magnetometry Reveals Inhomogeneities in Charge Storage and Weak Transient Internal Currents in Li-Ion Cells", PNAS, 117(20),10667.

* cited by examiner

*Primary Examiner* — Jas A Sanghera
(74) *Attorney, Agent, or Firm* — Brian J. Elliott; Grace B. Clinger

(57) ABSTRACT

A method for non-invasive characterization of an electrical charge storage device such as a lithium battery, containing lithium ions or lithium metal, the method comprising. The method includes the steps of a) providing at least one electric charge storage device; b) measuring a magnetic field generated by the at least one electrical charge storage device using at least one magnetic field sensor positioned in electromagnetic communication_to the electrical charge storage device; c) acquiring magnetic field data; and, d) determining the condition of the at least one electrical charge storage device using the magnetic field data. The method is operable and effective without magnetic shielding from external magnetic fields, including Earth's magnetic field.

20 Claims, 17 Drawing Sheets

|  | MFD-P | MFD-N | MFD-T | MFD-AA |
|---|---|---|---|---|
| End of Life (EOL) | ↓ | ↓ | ↓ | ↑ |
| Thermal Cycle | ↓ | ↓ | ↓ | ↓ |
| Impact | - - | ↑ | - - | ↑ |

Fig. 5

|  | MFD-P | MFD-N | MFD-T | MFD-AA |
|---|---|---|---|---|
| End of Life (EOL) | ↓ | ↓ | ↓ | ↓/xxxxx |
| Thermal Cycle | ↓ | ↓ | ↓ | - - |
| Impact | ↓ | ↓ | ↓ | - - |

Fig. 6

| Battery Type | Volume (mm³) | MFD-AA (nT) | Stand-Off (mm) |
|---|---|---|---|
| PowerStream 600 mAh | 6000 | 0.7 | 10 |
| PowerStream 1800 mAh | 17000 | 179 | 10 |
| 18650 LPO 1500 mAh | 16532 | 2800 | 76.2 vertical |
| 18650 LCO 2600 mAh | 16532 | 2800 | 76.2 vertical + 88.9 horizontal |

Fig. 8

NON-DESTRUCTIVE EVALUATION OF LITHIUM-ION BATTERIES

CROSS REFERENCE TO RELATED APPLICATION S

The present application claims the benefit of the provisional application No. 63/338,710 filed May 5, 2022 (titled Non-Contact Method for Non-Destructive Evaluation of Lithium Ion Batteries with Optically Pumped Magnetometer, by Joshua R. Biller, which is incorporated by reference herein.

STATEMENT REGARDING U.S. GOVERNMENT SUPPORT

This invention was made using U.S. government funding through the United States Air Force, SBIR Phase I Contract No. FA8649-20-P-0968. The government has certain rights in this invention.

BACKGROUND OF THE INVENTION

Rechargeable batteries have become a mainstay of modern life, powering modern electronics and underpinning the growth of the electric vehicle market. The best-performing of the rechargeable battery types continue to be Lithium-ion batteries (LiB) which have been a crucial enabling technology for portable personal electronics over the last two decades. They far outpace other battery types in terms of energy density per unit volume, are design flexible and can be formed into a wide variety of shapes and sizes to fit efficiently into the variety of devices they power. These batteries require maximum power, capacity, charging rate and a long life. Increasing energy density requires electrode couples with even higher operating voltages than currently available. This is especially critical for space flight and other aerospace applications like satellites. LiB can and do fail, often times catastrophically due to runaway thermal reactions.

All batteries will show performance loss during service, as evidenced by loss of capacity and an increase in internal resistance. The chemical equilibrium in batteries is very sensitive to temperature, and increases in internal resistance which lead to higher internal heat generation prime the battery for catastrophic failure. If the failing battery is in service in civilian or military aerospace applications, there is a threat to property and loss of life. Battery damage can come from aging, defects in manufacturing, or damage through the course of normal use (i.e. impact through electric vehicle car accidents). The continued growth in their use requires new tools and novel approaches for evaluating the health state of the battery, ideally at or in the environment of use.

The need to ensure device safety alongside increasing technological power is underscored by high visibility failures in LIBs. The major reason for the reoccurrence of such problems is difficulty tracking defects inside the LIB cell in a fast, field portable, non-destructive fashion. A reliable, rugged NDE technique is needed which can be deployed on the factory floor or depot with equal ease.

Li Ion Battery Construction

Commercial cells are typically assembled in a discharged state. The discharged cathode materials (i.e. $LiCoO_2$, $LiFePO_4$, $LiNiCoAlO_2$) and anode materials (carbon, graphite) are stable in atmosphere and easily handled in industrial processes. After construction the two electrodes are connected externally to an electrical supply. Electrons are forced to be released at the cathode and move back into the anode. Simultaneously, $Li^+$ move from the cathode to the anode via the electrolyte. All components of the battery start life with a particular magnetic signature whose changes during battery use are directly related to structural rearrangement at the atomic and molecular scale. Damage at the molecular scale proceeds microscale damage which can lead to shorts and thermal runaway.

Thermal runaway of battery pack is often induced by thermal runaway of a single cell. Energy storage packs are often located in confined spaces without HVAC. On hot, sunny days interior temperatures can be quite high. In addition, charging adds to the internal temperature of the batteries. The combination of high internal temperature, high ambient temperature and input of energy through charging is a recipe for thermal runaway. Prior to use in an aerospace vehicle or satellite, the LiB pack may have experienced many environments which have already predisposed the cells to failure. The ability to confirm acceptable SoH at the manufacturing floor, and then again before the LiB pack is put into use is crucial in avoiding destruction of Air Force personnel and property.

LiB decay at high temperatures but charging at low temperatures increases the risks of Lit dendrite formation. "Hot spots"—created either by dendrite formation or separator damage that results in connection of anode and cathode—drive thermal runaway. Gas evolution during thermal run away distorts the structure of the prismatic cells causing delamination of electrode and current collecting layers. Any localized distortion in the battery architecture can lower the barrier for distortion/short circuiting in the surrounding battery area. While there has been some study of composition and structure at elevated temperatures, only a few recent studiesw[13, 14] have focused on change in internal architecture on the lead up to elevated temperatures. The likelihood of thermal runaway increases with battery age, can be induced by any route that brings the anode/cathode and current collectors into direct contact, for instance physical deformations like crushing stress, or puncture damage.

The existing strategies for determining battery health and identifying defects each have limitations. Discharge tests are not applicable online, and Coulombic counting is sensitive to side reactions and requires continuous recalibration. Measurement of open-circuit-potential (OCP) needs long rest times (10 minutes) before the measurement can be made. Electrical-Impedance-Spectroscopy (EIS) as a field application is cost intensive and temperature sensitive. Kalman filters need large computing capacitances, a suitable model, and very well-defined parameters. Two novel applications which have some promise have been XRayCT and MRI, but both techniques are not easily translated in their current form out of the laboratory.

X-Ray CT has been developed as a successful technique for analyzing electrochemical cells in laboratory space. Slow analysis time, and hardware which is not optimized for fast, in situ use are major drawbacks which severely limit high throughput applications on a manufacturing line. The aluminum, graphite and separator materials exhibit low attenuation of X-Ray and are therefore difficult to distinguish. Radiographic sources are expensive, and the hazards of ionizing radiation must be taken into account. In addition, radiographic testing requires two-sided access to the part under investigation. While an excellent technique for laboratory investigations, translation into the depot or manufacturing floor is more complicated.

Surveys of the magnetic behavior of LiB with magnetic resonance imaging (MRI) have yielded valuable information on electrolyte behavior and dendritic growth in cells specially designed around RF access at high magnetic fields[2]. A limitation of typical MRI studies is their execution at high magnetic field strengths where conductors, such as the aluminum liner of pouch LIB, are not transparent to incident RF radiation during the experiment. MM units with large enough volume to do NDE analysis of LiB are not commercially available yet.

MRI is the wrong tool for lithium-ion battery non-destructive evaluation, but measuring the change in magnetic signature due to changes in the battery structure is the right approach. The same parts of the Lithium ion battery that caused distortion of the MRI field are directly measured using an optically-pumped-magnetometer (OPM). The OPM is a mature technology, commercially available, portable and very small. The current focus of the field for OPM development is on medical imaging of the magnetic fields associated with transmitted nerve electrical impulses.

In U.S. patent Ser. No. 11/619,686 B2 Uchida teaches construction of a magnetic sensor and sensing system based on a magneto resistive material and interpretation circuit. The instruction is geared towards the device itself and not an application for interpretation of phenomena.

In U.S. patent Ser. No. 11/598,824 B2 Motz teaches a different magnetic monitoring device based on the use of a pair of inductive coils. In this case the first inductive coil generates a measurement magnetic field which is used to interrogate a material. The response magnetic field, which is a combination of the measurement magnetic field generated by the first coil and the specific material response is detected by the second inductive coil.

In US patent 20220349943 Mima et al. teach a magnetic sensor which operates after application of an alternating current stimulus to a storage battery. A complex circuit is required in combination with the magnetic sensor including a secondary cancellation coil, and a feedback circuit based on the battery response. The magnetic sensor in this case requires the presence of a flowing battery current and precludes measurement in the open-circuit state.

In US patent 20180180479 A1 Lee et. al. teach a magnetic sensor applied at the power line of an automotive lead-acid battery. Magnetic sensing in this case is only accomplished when current is flowing from the battery, is specific for lead-acid batteries, and is more about an automotive battery sensing system which can be coupled with a smart phone application for ease of monitoring.

In U.S. Pat. No. 8,198,684 B2 Koch teaches a magnetic based sensor specific installation on automobiles combined with a state of charge (SOC) monitoring module. Careful investigation of FIG. 3 in the patent shows the magnetic sensor is not passive. The construction of the magnetic sensor includes a strain gauge, and a permanent magnet connected to the strain gauge. Magnetic characteristics of the battery are read out indirectly through pressure of the permanent magnet on the strain gauge.

US patent 20220347402 A1, Kendall et al., teach a method for non-invasive characterization of a battery cell by way of measuring the magnetic field generated with a plurality of magnetic field sensors positioned adjacent to the battery. The technique described can also be used to measure batteries in an active state (open-circuit or no-load applied). As shown in FIG. 5 of the patent, the generated magnetic field data must be further processed into a current density profile output before determination of the cell condition can be accomplished.

Hu (Hu, 2020) discloses a apparatus that consists of:
(A) The QZFM—zero field magnetometer—a vector magnetometer with an operating range of −5 to +5 nT.
(B) A specially designed 3 ft long, hand wound solenoid to generate 20 uT of excitation field
(C) Four concentric cylinders of high-nickel alloy mu-metal to cancel the effect of the Earth's magnetic field
(D) A specially designed non-magnetic belt to pull the battery through the solenoid and underneath the QZFM.
(E) The data processing to remove the 60 Hz signal originating from electric lights and power outlets in the vicinity of the OPM The operating range of the QZFM precludes its use measuring commercial batteries with ferromagnetic casings, such as those employed in the battery packs of electric vehicles or personnel electronics. The design and magnetometer (magnetic sensor) described in Hu are not capable of making the measurements or employing the method we describe here.

Further, experts in the art of magnetometry would assume the battery steel casing material would obscure any useful information from the inner materials—it is not obvious you could make the measurement of the battery cathode/anode materials through a ferromagnetic material.

SUMMARY OF THE INVENTION

There is currently no NDE technique for measuring LiB health which is non-contact and field portable. The existing strategies for determining battery health and identifying defects each have limitations. Discharge tests are not applicable online, and Coulombic counting is sensitive to side reactions and requires continuous recalibration. Measurement of OCP needs long rest times (10 minutes) before the measurement can be made. EIS as a field application is cost intensive and temperature sensitive. Artificial neural nets require extensive training on the same battery type, so that one neural net program is not immediately applicable to wide variety of batteries. Kalman filters need large computing capacitances, a suitable model, and very well-defined parameters. Two novel applications which have some promise have been XRayCT and MM, but both techniques are not easily translated in their current form out of the laboratory for use in QA/QC X-RayCT has been developed as a successful technique for analyzing electrochemical cells in laboratory space. Slow analysis time, and hardware which is not optimized for fast, in situ use are major drawbacks which severely limit high throughput applications on a manufacturing line. XRayCT also misses some aspects of the subtle physical/chemical changes of the anode/cathode of the cell, being better suited for hard structures like the current collecting pieces. Specifically, the aluminum, graphite and separator materials exhibit low attenuation of X-Ray and are therefore difficult to distinguish. Radiographic sources are expensive, and the hazards of ionizing radiation must be taken into account. In addition, radiographic testing requires two-sided access to the part under investigation. While an excellent technique for laboratory investigations, translation into the depot or manufacturing floor is more complicated.

Surveys of the magnetic behavior of LiB with magnetic resonance imaging (MRI) have yielded valuable information on electrolyte behavior and dendritic growth in cells specially designed around RF access at high magnetic fields. A limitation of typical MM studies is their execution at high magnetic field strengths where conductors, such as the aluminum liner of pouch LiB, are not transparent to incident RF radiation during the experiment. Recent studies have shown that the distortion in the magnetic field of a MM magnet can be tied to chemical and physical defects inside the cell.

The present invention solves the limitations of the prior art and teaches a method of determining the state of charge or state of health of electrochemical cells such as lithium batteries using a magnetic field sensor. The invention teaches a method for non-invasive characterization of an electrical charge storage device containing lithium ions or lithium metal, the method comprising: a) providing at least one electric charge storage device; b) measuring a magnetic field generated by the at least one electrical charge storage device using at least one magnetic field sensor positioned in electromagnetic communication (at a stand-off distance that is effective to measure magnetic, electromagnetic or electronic fields, such as 1 inch, 2 inches, 3 inches, 4, 5, 6, 7, 8, 9, or 10 inches, 1 foot, 2 feet, 3 feet, 4 feet or 5 feet) to the electrical charge storage device; c) acquiring magnetic field data; and, d) determining the condition of the at least one electrical charge storage device using the magnetic field data. Optionally the measuring a magnetic field generated by the at least one electrical charge storage device does not require magnetic shielding from external magnetic fields or does not require magnetic shielding from Earth's magnetic field. Alternatively, step b) may be measuring a magnetic field generated by the at least one electrical charge storage device using at least one magnetic field sensor positioned in "magnetic" communication (at a stand-off distance that is effective to measure magnetic, electromagnetic or electronic fields, such as 1 inch, 2 inches, 3 inches, 4, 5, 6, 7, 8, 9, or 10 inches, 1 foot, 2 feet, 3 feet, 4 feet or 5 feet) to the electrical charge storage device.

In the following embodiments the term "electrical" can be replaced with "electrochemical".

In other embodiments, the measuring a magnetic field generated by the at least one electrical charge storage device occurs while the at least one electrical charge storage device is in an open circuit configuration or a closed circuit configuration. Optionally, the at least one electrical charge storage device is at least two electrical charge storage devices.

In other optional embodiments, the at least one electrical charge storage device is a multi-battery pack in an open or a closed circuit configuration.

In certain embodiments, the determining the condition of the at least one electrical charge storage device using the magnetic field data comprises determining a state-of-charge or a state-of-health of the at least one electrical charge storage device. The at least one electrical charge storage device may comprise a lithium battery with an anode comprising a paramagnetic or a ferromagnetic material, optionally lithium. The at least one electrical charge storage device may comprise a lithium battery with a cathode comprising a paramagnetic or ferromagnetic material, optionally nickel.

In other embodiments the determining the condition of the at least one electrical charge storage device using the magnetic field data compromises evaluating growth of a solid electrolyte interface, or detecting a defect within the cell, or detecting inhomogeneities within the at least one electrical charge storage device introduced during manufacture.

Optionally, the method can be repeated by repeating the steps of measuring, acquiring and determining on the same electrochemical stage device one or more times after a period of use: at least 30 minutes, optionally at least 3 hours or more, or at most 72 hours, optionally at most 50 hours.

The method can be used on batteries or electrochemical storage devices in a state of full charge or partial charge when the method is performed, optionally wherein a state of partial charge is between 0% and 90% of full charge, and optionally wherein the method is performed before an external electrical load has been placed across the terminals of the electrical charge storage device.

The method can have the measuring a magnetic field accomplished using a sensor, wherein the sensor is selected from the group consisting of an optically pumped magnetometer, a Hall probe, fluxgates, a magneto-resistive sensor, and a magneto-electric sensor.

The method is also for non-invasive characterization of an electrical charge storage device containing lithium ions or lithium metal, the method comprising: measuring a magnetic field generated by the electrical charge storage device using a single magnetic field sensor or a plurality of magnetic field sensors positioned adjacent to the electrical charge storage device, the measuring producing magnetic field sensor data, wherein the measuring is performed while the electrical charge storage device is in an active or passive state; wherein the measurement is performed for a single charge storage device, or multiple charge storage devices in a pack or module; wherein a plurality of charge storage devices in a pack or a module are in service in an electric vehicle, or being transported between two locations; determining the condition of the electrical charge storage device directly from the magnetic sensor data; wherein condition of the electrical charge storage device can be state-of-charge (SOC) or state-of-health (SOH).

The invention also teaches a method comprising repeating the steps of measuring magnetic field and determining the condition of the cell directly from the magnetic field data in order to monitor developments in the condition of the cell.

BRIEF DESCRIPTION OF THE FIGURES

FIG. 5 Characteristic patterns in MFD-metrics for different LPO states

FIG. 6 Characteristic patterns in MFD-metrics for different LCO states

FIG. 8 Comparison of battery volumes and charge capacity show the magnetic field signature is dependent on both FIG. 9 Schematic showing the suite of magnetometers available for measuring the characteristic magnetic field amplitudes at each step in the LiB production to the final battery product. QA/QC on the manufacturing floor prior to cell assembly is feasible through high sensitivity magnetometers such as the optically pumped magnetometer (OPM, an atomic magnetometer) while measurements on full form batteries (such as shipment monitoring or electric vehicle battery pack diagnostics after an accident) can be done with lower sensitivity chip magnetometers (e.g. fluxgate, hall effect, geomagnetic sensor etc.). This shows versatility of our technique to select the right magnetometer for the right application.

FIG. 2). Changes in this signature correspond to a LiB's health and state-of-charge.

FIG. 12 1D profile showing state-of-charge monitoring via a chip magnetometer of three LiB's, 18650 cells with $FePO_4$ cathode chemistry (each at a different state-of-charge), for increasing standoff heights. The state-of-charge was measured via columbic counting on a Maccor battery cycler and the corresponding magnetic field amplitudes show differences for the three batteries, most notably in the Z-axis, where the magnetic field becomes lower (more negative) for increasing state-of-charge. The corresponding X-axis, and Y-axis data is also shown.

FIG. 14 2D spatially resolved plots showing health monitoring of a 3×3 LiB array (18650 cells, $FePO_4$ cathode chemistry) via a chip magnetometer. The middle battery was determined to be defective via electrical impedance spectroscopy prior to magnetometry measurements. This array (i.e. battery pack) setup is a characteristic form factor of open-circuit batteries in a package for shipment. The middle battery was easily identified as defective within the pack due to the large magnetic field changes in respect to the healthy LiBs. The spatial resolution afforded by the chip magnetometer is high enough to identify the defective LiB in the center with a gap of 2 mm between cells.

DETAILED DESCRIPTION OF INVENTION

Figure 1:
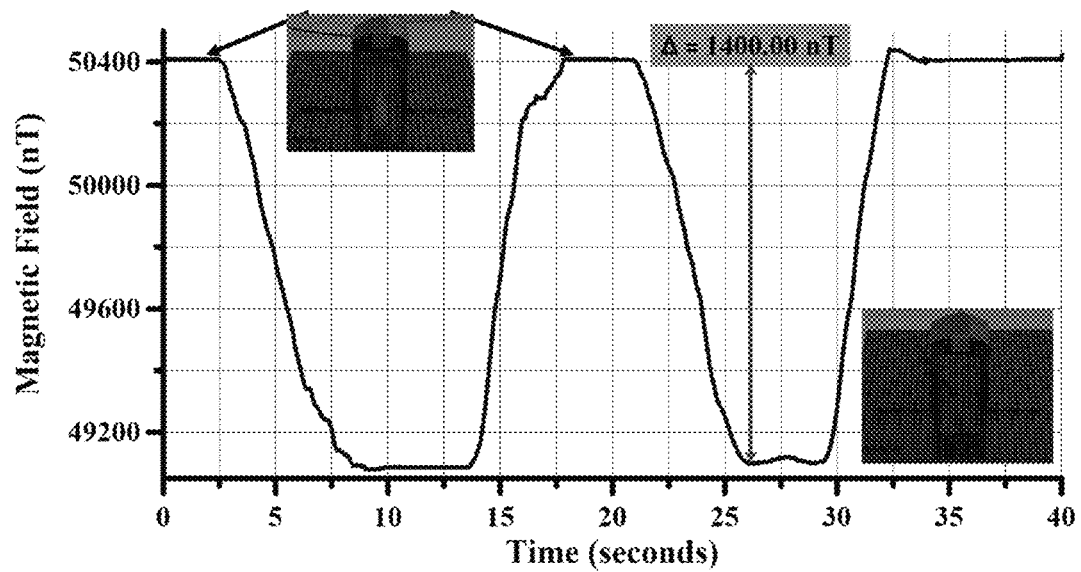
FIG. 1 The shift in measured magnetic field signal from the OPM when the LPO 18650 cell is inside a non-magnetic measurement scaffold.

The invention teaches:
(A) Use of any scalar or vector magnetometer with sensitivities for measurement between 10 nT ($1\times10^{-9}$T) and 1 mT ($1\times10^{-3}$ T).
(B) Use of the magnetometer measurement of commercial batteries which we have found to have:
   100-1000 nT of magnetic field distortion attributed to a nickel-plated steel casing
   anywhere from 1,000 nT to 20,000 nT of magnetic field distortion attributed to the cathode materials in a $LiFePO_4$ or $LiCoO_2$ 18650 commercial battery cell when operated at a distance.
   Anywhere from 10 to 500 μT ($1\times10^{-6}$ T) of magnetic field distortion when operated close to or on the batter.
(C) The non-magnetic structure to hold the magnetometer at the right distance from the battery. This can be made of plastic and stationary, or suspended from a gantry or other device that results in the magnetometer scanning over the battery at the correct distance. The correct distance is a balance of close enough to see small changes in battery MFD as a function of change in health status and far enough away that the MFD from the battery falls does not saturate the magnetometer chosen for detection.
(D) The data processing to remove the 60 Hz signal originating from electric lights and power outlets in the vicinity of the magnetic field detection device as needed.
(E) The data processing and "know-how" to:
   assemble the measurement files for each position on the battery and assemble into one dataset
   Determine the state of charge (SOC) and state of health (SOH) directly from the magnetic readings from the battery materials.
(F) The data processing to capture and present the anisotropic 3-dimensional nature of the battery's magnetic field signature into a one-dimensional figure-of-merit (FOM).
(G) Use of the FOM is required when using a scalar magnetometer and rotating the magnetic sensor around the battery, battery pack or battery module.
(H) One example of such a FOM is the magnetic-field-distortion (MFD) metric. MFD from battery measurement positions by subtraction of the Earth's magnetic field acquired at the start of measurement.

(I) The data processing to calculate from the assembled battery measurement points the MFD parameters—MFD-P, MFD-N, MFD-T and MFD-AA.
(J) Changes in these FOM are correlated to battery health and can be used to screen out defective batteries.
(K) When using a vector magnetometer, changes in anisotropic magnetic field distribution are read out directly to determine SOC and SOH.

The present invention provides a method for characterization of a cell, or of a cell in a module or a pack, or of the individual materials of a cell during manufacturing, by measuring the magnetic field of the battery by a single sensor or plurality of sensors adjacent to the cell. Wherein the cell or cells are in an active or passive state, and wherein the cell condition is determined directly from the magnetic field values without further need for calculation or modeling.

The cell condition may refer to state of health (SOH) or state of charge (SOC).

The change in magnetic field signature may also indicate the presence of defects at the cathode, anode or SEI layer for a fully constructed cell, or defects within individual cell components during manufacturing.

By passive it is meant no load is applied, that the cell is in the "open-circuit" state. By active it is meant the cell is connected to a voltage and/or one or more other cells in a module or a pack.

The present invention is non-invasive and non-destructive and may be used to create a profile of a cell or multiple cells connected or separate. By non-invasive it is meant operated outside the cell. By non-destructive it is meant the whole cell or components of the cell are not consumed or degraded during the measurement.

A profile can mean data linked to the area/dimensions of a cell component or of the full cell during manufacturing or use or evaluation of cell transitioning from one example to the next. For example, when determining if cells used first for electric vehicles can be used secondarily for power storage applications after their automotive application is completed.

The direct magnetic field may be coupled to spatial coordinates and/or mapped onto a 2D or 3D image of the cell, cathode, anode or other battery component.

The present invention does not require the use of any specially designed magnetic shielding environment, or transport of cells or modules into the shielding environment for measurement. The present method can be applied on the factory floor, inside an electric vehicle, or as a safety tool for first responders after an electric vehicle crash.

The plurality of magnetic field sensors may be any magneticsensors/magnetometers having the required sensitivity for a particular application. These may include, but are not limited to: OPMs; Hall probes; fluxgates; magneto-resistive sensors; and magneto-electric sensors. The magnetic field sensors may comprise any combination of the different types of sensors described herein.

In the specification and the claims the following terms are given their plain meaning and further defined as follows:

The term "anisotropy" means a physical property which is different when measured in different X-, Y- or Z-directions.

The term "state of health (SOH)" means an indication of a level of degradation and remaining capacity of a battery.

The term "state of charge (SOC)" means the level of charge of a battery, relative to its fully rated capacity.

The term "cathode" means the positive or oxidizing electrode that acquires electrons from the external circuit and is reduced during the electrochemical reaction.

The term "anode" means he negative or reducing electrode that releases electrons to the external circuit and oxidizes during and electrochemical reaction.

The term "LPO" means a type of lithium-ion battery where the cathode chemistry is lithium-iron-phosphate, $LiFePO_4$.

The term "LCO" means a type of lithium-ion battery where the cathode chemistry is lithium-cobalt-oxide, $LiCoO_2$.

The term "FOM" means figure-of-merit, a quantity used to characterize the performance of a device, system or method.

The term "MFD-P" mean the absolute value of the measured magnetic field distortion at the positive terminal.

The term "MFD-N" means mean the absolute value of the measured magnetic field distortion at the negative terminal.

The term "MFD-T" means the combined absolute value of the measured magnetic field amplitude as a sum of MFD-P and MFD-N The term "MFD-AA" means the absolute value of measured magnetic field amplitude from the most positive and most negative magnetic field distortions, when referencing the Earth's magnetic field as a baseline.

The term "EIS" means electrical-impedance-spectroscopy, a technique which connects directly to cell and can measure relevant parameters of the internal workings of cells like charge-transfer resistance and the presence of defects in battery materials.

Example 1. The Measured Magnetic Field Signature of Intact Cells Comes from the Battery Materials Rather than the Ferromagnetic Casing 18650 cells are one example of a full LiB cell with a protective ferromagnetic steel casing. Other examples include the 14650, 17490, 21700, 26650, all of which have ferromagnetic steel casing. The ferromagnetic casing can be a nickel (Ni) coated steel. Prismatic pouch cells with aluminum liners do not contribute at all to the magnetic field signature of the full battery material. The ferromagnetic signature of A3 carbon steel or nickel-plated steel contributes only −10% of the amplitude measured in the magnetic field signature. That is, even with the presence of a ferromagnetic casing material, the dominant signal being measured is derived from the battery materials (cathode, anode, electrolyte, separator) inside the cell (FIG. 1)

18650 LiB cells (18 mm diameter×65 mm long) with either $LiFePO_4$ or $LiCoO_2$ cathode chemistries are the workhorse battery form factor for a number of LiB applications. The 18650 cell is used in power tools, cameras and laptops. Some of the battery packs which power the electric vehicles from Tesla are composed of 7,104 18650 cells connected in series, grouped into a several modules. The most common casings on a commercial 18650 cell is made of A3 carbon steel, which is itself ferromagnetic, or aluminum. The nickel-plated A3 steel as the casing material was confirmed for the $LiFePO_4$ batteries we ordered after communication with the battery manufacturer.

Figure 2:
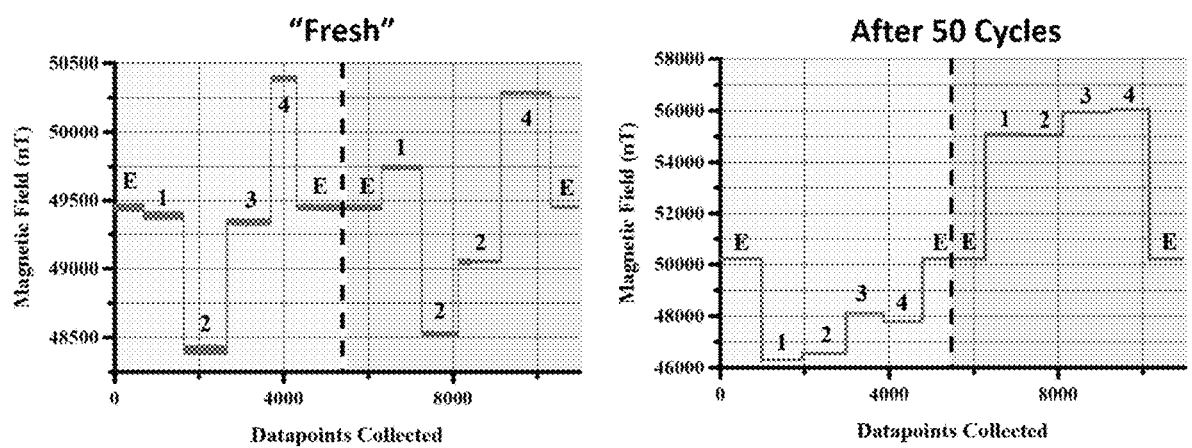
FIG. 2 The LPO battery was cycled at 1 C charge/discharge rate before reaching EOL (<80% capacity) after 50 cycles. The numbers correspond to the marked positions on the perimeter of the battery. The Earth's field reference value recorded at the beginning and end of each measurement is marked with "E". The analysis at the positive and negative terminals is indicated with red and black shading, respectively.
Figure 3:
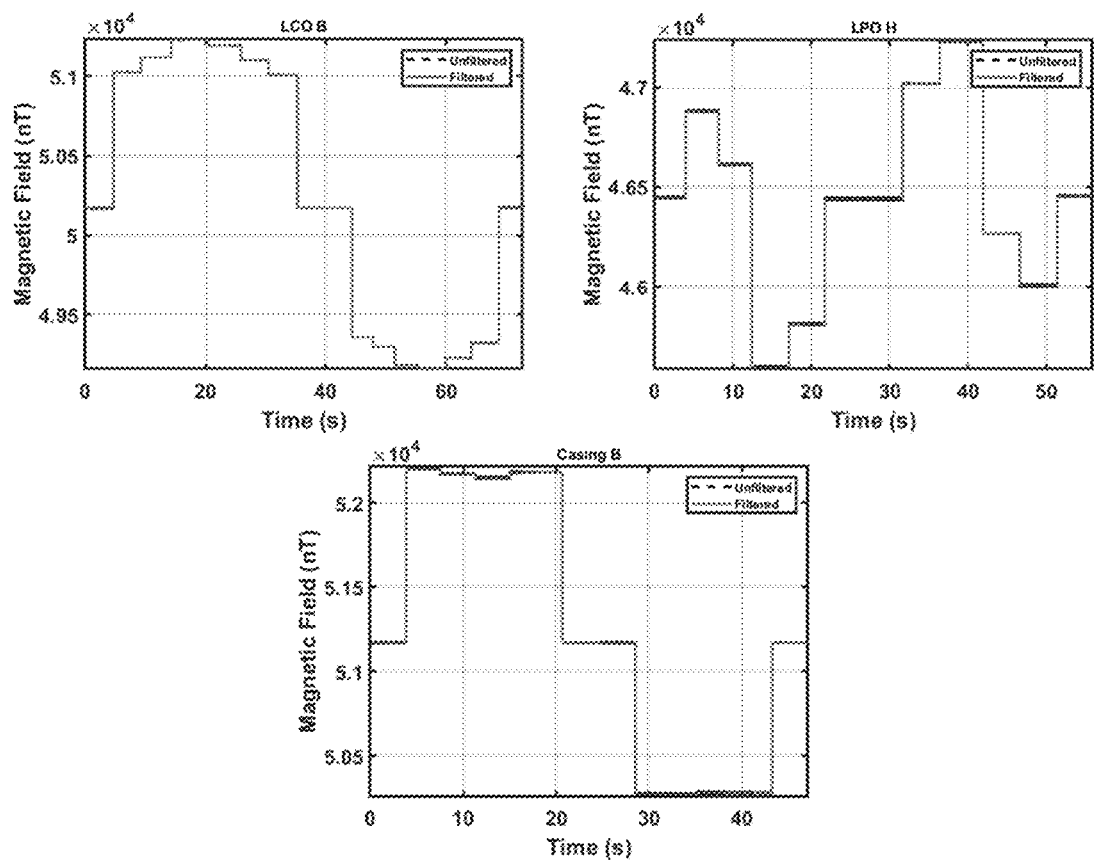
FIG. 3 Comparison of 2D MFD profile for batteries vs. empty steel casing. The profiles are dominated not by the ferromagnetic 18650 casing, but by the magnetic signature from the battery material inside the casing.

A3 is an air-hardened carbon tool steel, which has a ferromagnetic microstructure (is magnetic), and a nickel content between 0.9-1.4%. Many scientists and engineers practiced in the art of magnetometry would make the assumption that the ferromagnetic field distortion from the A3 carbon steel casing would be so large as to obscure the magnetic field distortions from any other source (i.e. battery materials). We have shown that while there is some magnetic field signature from the steel casing in our measurement, it is 10× smaller than the magnetic field distortion coming from the battery materials. Empty nickel plated 18650 casings were measured and comparing to the measurements for intact 18650 cells (FIG. 3). Furthermore, when the casing is removed and the inner material exposed to oxygen in the air, slight thermal decomposition occurs and the magnetic field distortion of the battery falls by 22× (1400 nT down to 61 nT). We also observed that the magnetic field signature of both LPO and LCO cells decreases by 50% after battery cycling, but never to levels as low as the blank casing alone (FIG. 2).

The polymer/plastic casings do not have a magnetic signature, and in this case the magnetic signature is from the cathode or battery material exclusively. That the right magnetometer can measure magnetic signatures of battery materials in both steel or plastic casings shows the technique is agnostic to the casing material, which is very beneficial for deploying the tool on a variety of different battery types for fast analysis. For steel battery casings, the option exists to further refine the measurement by subtracting the small contribution of the steel casing, but this is not a requirement for distinguishing "healthy" from "used" batteries.

Example 2. The Magnetic Signature of LiB is Anisotropic

Figure 4:
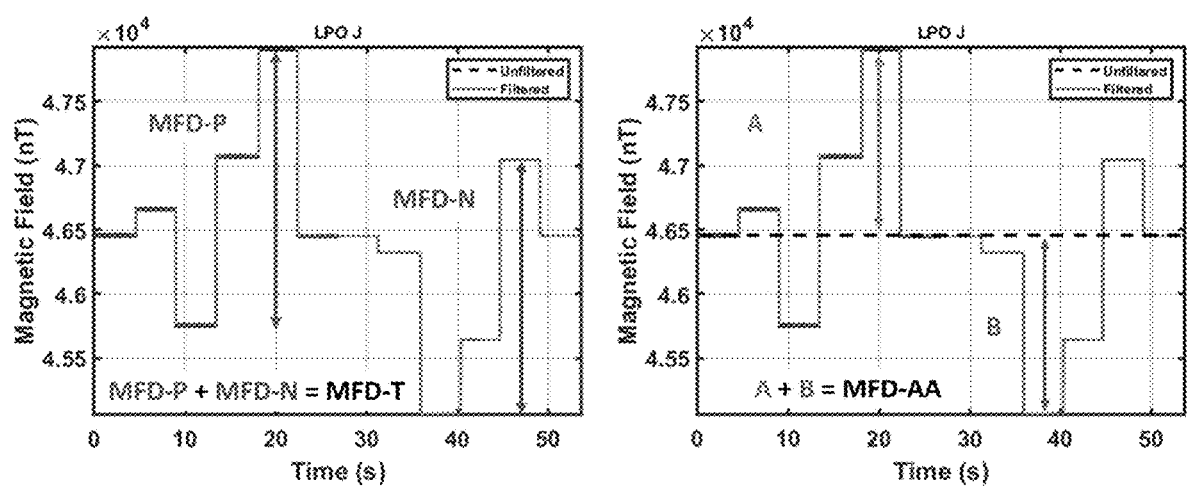
FIG. 4 Illustration of the parametrization of the 2D plots created by scanning around the positive and negative terminals of a 18650 LPO cell. The example figure of merit (FOM) is the magnetic field distortion (MFD) parameter. This parameter can reference change in the magnetic field from the battery at the positive terminal (MFD-P), negative terminal (MFD-N), the sum of changes around both terminals (MFD-T), and the highest absolute magnetic field distortion value anywhere across the whole battery (MFD-AA).

The magnetic field signature from the battery materials is anisotropic and interrogated differently when using a scalar (amplitude only) or vector (amplitude and direction) magnetometer. For a vector magnetometer, the X-, Y-, an Z-magnetic amplitudes can be used directly as 3D information on the change in magnetic field as a function of SOC or SOH. For a scalar magnetometer, a figure of merit (FOM) is defined that represents movement of the scalar magnetometer around a stationary battery to collect 3D information reduced down to a 1D measurement (FIG. 4).

The 1D FOM is created by designating specific positions at a location on the battery, in this case the positive and negative terminals. A scalar magnetometer makes amplitude measurements at each location which are numerically designated (positon, 1, 2, 3, 4 etc.) and encircle the cell. The change in magnetic field signature at the same position is monitored over time can be plotted in a graph (FIG. 4). Rather than generating full graphs for each time points, the change in a measurement at a specific location can be designated as a FOM. For example, the absolute magnetic field amplitude relative to Earth's field on the positive terminal has a FOM called "MFD-P". Rather than reporting magnetic field values for all spatial locations measured on the positive terminal, a single MFDP-P number can indicate the maximum change across all positions (FIG. 4).

A similar FOM can be calculated for the negative terminal, and called MFD-N. The MFD-P and MFD-N can be combined into a total absolute magnetic field distortion, MFD-T, and so the entire cell can be reduced to a single numerical FOM which represents a complicated, 3D anisotropic magnetic field profile of the battery cell.

Example 3. The Magnetic Field Signature of LiB Cells Changes as they are Used in a Way which is Specific to the Cathode Chemistry Accelerated battery lifetime was simulated using multiple charge/discharge cycles on a Maccor battery cycling device. There were clear trends in the FOM MFD-P, -N, -T and -AA for LPO cells when comparing pre-cycled to post-cycled batteries. The way in which the magnetic field signature changes is a characteristic "fingerprint" for a cell with a specific cathode chemistry (FIG. 5, FIG. 6).

The hallmark in a post-cycled LPO battery was a very large—up to 12.5×—increase in FOM MFD-AA. Unlike the trends in pre-cycle MFD-T, -P and -N, the increase in MFD-AA was not correlated with how many cycles the battery underwent. Rather, the large increase in MFD-AA was indicative of a battery with a charge capacity <80% or in a defective state.

For LCO batteries there was a clear decrease in MFD-T for batteries which were fully cycled. MFD-T decreased by between 30 and 75% from pre- to post-cycle. Day to day collected on a control battery established the inherent measurement error from the OPM as only 5%. A hallmark of a cycled LCO battery was always a precipitous drop in MFD-T comparing pre- to post-cycle.

Figure 7:
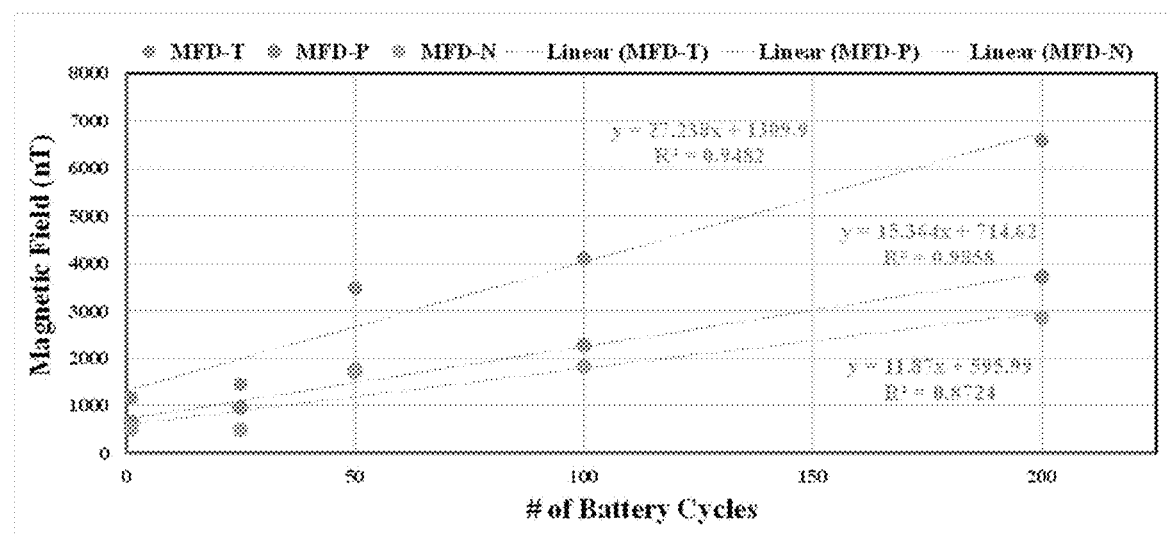
FIG. 7 LPO batteries which lasted the longest time in accelerated testing started with the highest MFD metrics.

Example 4. The Starting Magnetic Field Signature of a Fresh Battery can be Used to Predict Lifetime for Some Cathode Chemistries For LPO cells, a higher starting magnetic field amplitude specifically in the metrics MFD-P, MFD-N and MFD-T correlated with and increased number of charge/discharge cycles in accelerated battery testing (FIG. 7).

Example 5. The Magnitude of the Magnetic Field Distortion is Dependent on the Cathode Chemistry, the Size of the Cell, and the Charge Capacity Small pouch LiB which were specifically selected because they have been used to demonstrate magnetic signature monitoring with the most sensitive zero-field type of OPM. The battery has been specifically designed "without ferromagnetic materials" for use near magnetometers and in MM rooms. The term "non-magnetic" is mis-leading, as it only references the lack of nickel foil commonly used in lithium polymer batteries which is the main difference (nickel is also ferromagnetic). The cathode material of this style of battery in nickel-manganese-cobalt-oxide. Nickel and cobalt are ferromagnetic, and $Mn^{2+}$ is paramagnetic.

600 mAh "non-magnetic" as well as larger sized 1800 mAh "non-magnetic" batteries were acquired. For higher mAh ratings, or larger sized batteries, the signal to be observed is simply larger, and large enough to be easily detected with magnetometers less sensitive than a zero-field OPM (FIG. 8).

The 1800 mAh pouch cell is twice as thick (10 mm vs. 5 mm) as the 600 mAh cell, and about 40% larger in $mm^2$ area (1700 $mm^2$ vs. 1200 $mm^2$). A volume calculation for each battery type is shown in (FIG. 8). The volume of the 1800 mAh pouch cell, and the LPO and LCO 18650 cells are similar, and much higher than the volume of the 600 mAh pouch cell. The voltage rating is the same for each battery (3.7 V), but the charge capacity differs from decreasing to increasing as LPO 18650<pouch 1800 mAh <LCO 18650. However, the order of largest (pre-cycle) magnetic field values are LCO >LPO >pouch 1800 mAh.

Figure 10:
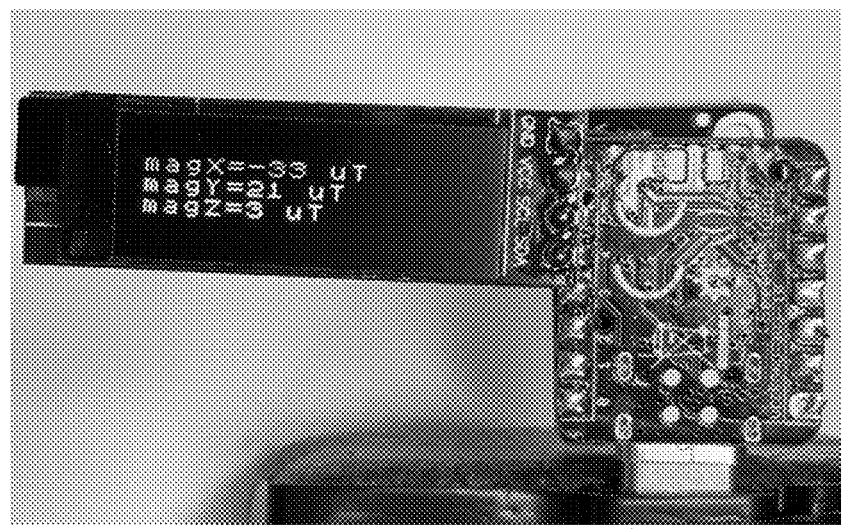
FIG. 10 Picture of a chip magnetometer mounted to a prototype board providing direction and amplitude of the Earth's anisotropic magnetic field in X-, Y- and Z-directions. The Z-axis points into the page.
Figure 11:
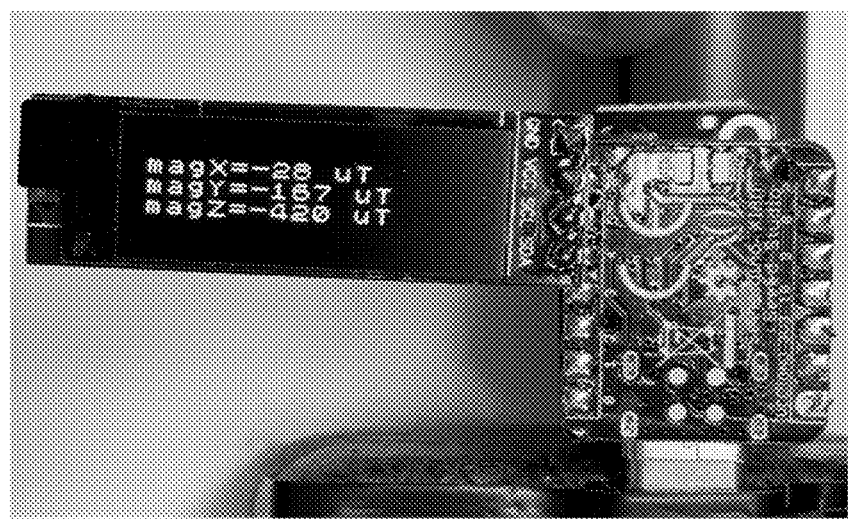
FIG. 11 Picture of a chip magnetometer displaying the magnetic signature of a commercial 18650 LiB ($FePO_4$ cathode chemistry) which is 10-100× larger than Earth's anisotropic magnetic field (c.f.

Example 6. Non-Contact Health and State-of-Charge Monitoring for Shipment of LiB's or LiB Packs Used for Electric Vehicles Determining LiB's state-of-charge and health prior to or during shipment (or in response to an electric vehicle accident), requires probing of the magnetic signature between 0" and 1" away from the cell or pack. This distance accounts for the thickness of packaging while ensuring high enough spatial resolution to detect single cells. Our initial studies indicated that LiB 18650 cells with charge densities above 1500 mAh have magnetic field amplitudes in the 100s of µT (FIG. 11) which exceeded the detection limit of an OPM (i.e. the OPM was too sensitive) even at a ~3" standoff. Furthermore, this is a signal ~10-100× larger than that of Earth's magnetic field (FIG. 10) and can be easily distinguished without needing shielding or other external fields.

Instead of the OPM, an inexpensive rugged 3-axis chip magnetometers for LiB cells with relatively high charge capacities and battery packs. The lower sensitivity of the chip magnetometers allows detection in closer proximity to the LiBs which improves the spatial resolution for determining the state-of-charge or health of single cells in a battery pack.

Figure 14:
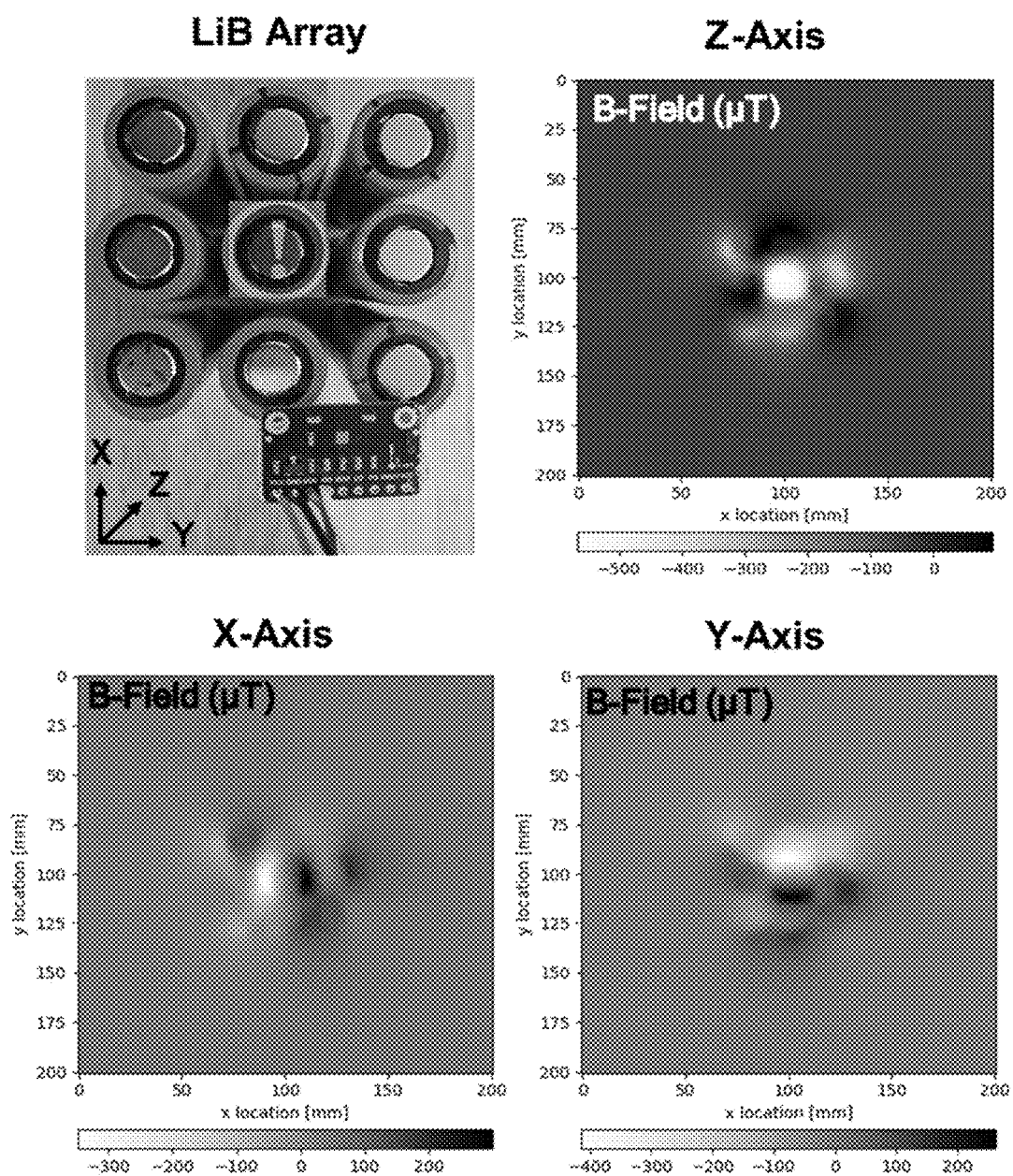

An array of 9 total 18650 LiB cells with LiFePO$_4$ cathode chemistry was set up, with a defective cell (determined via EIS) placed in the middle of the 3×3 array FIG. 14. The LiB's are spaced 20 mm apart center-to-center which leaves a ~2 mm gap between cells. A 3-axis chip magnetometer was mounted on an automated scanning gantry at a 3 mm standoff height, with 20 mm spacing center-to-center between batteries. An automated gantry was used to scan the magnetometer over the 9-battery array using a step size in between measurements of 1 mm. The defective battery (center) can be easily identified in the B-field map as a significant negative increase in the magnetic field strength, in relation to the other 8 LiBs, as measured in the Z-axis direction with an amplitude of more than −550 µT (FIG. 14).

Figure 12:
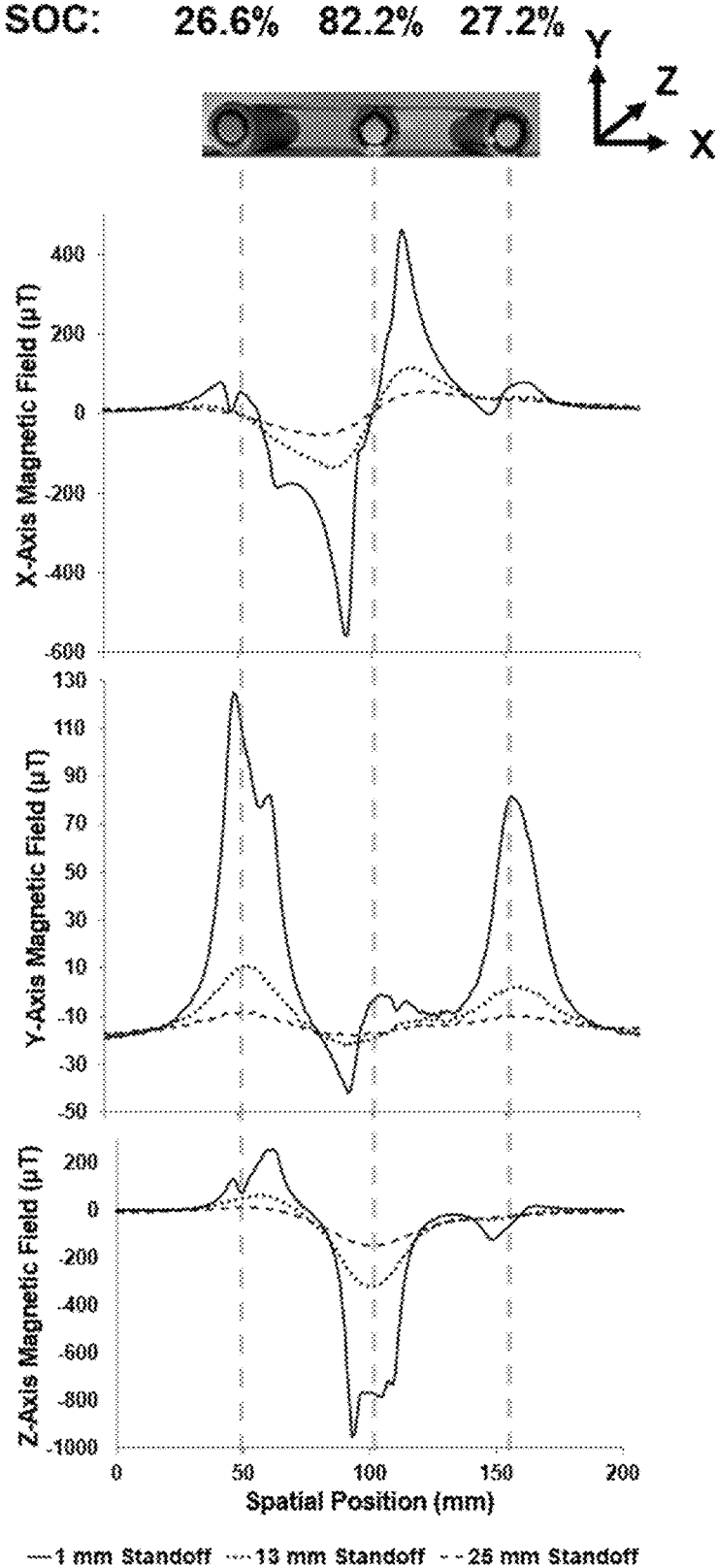

The magnetic field signature is also correlated with the LiB's SOC. Three batteries and their SOC was measured on a Maccor battery cycler after the initial magnetometry data was collected. The SOC was measured by discharging the battery at 0.5 C (50% of total capacity per hour) with a 2.5 V cutoff voltage, while monitoring the current release over time. The extracted capacity values of 399 mAh, 1233 mAh, and 408 mAh were then divided by their maximum rated capacities of 1500 mAh and the corresponding SOC is shown in FIG. 12. Their individual magnetic field signatures were collected by an automated gantry scanning approach, using a 1 mm step size, and a 1D profile was generated for the three open-circuit cells. The SOC is clearly correlated with different magnetic field signatures, as measured with the 3-axis chip magnetometer. Furthermore, each axis provides a unique fingerprint which provides information not just on SOC, but on battery health, including the presence of defects as seen from the large negative amplitude in the Z-axis data (FIG. 12).

Figure 13:
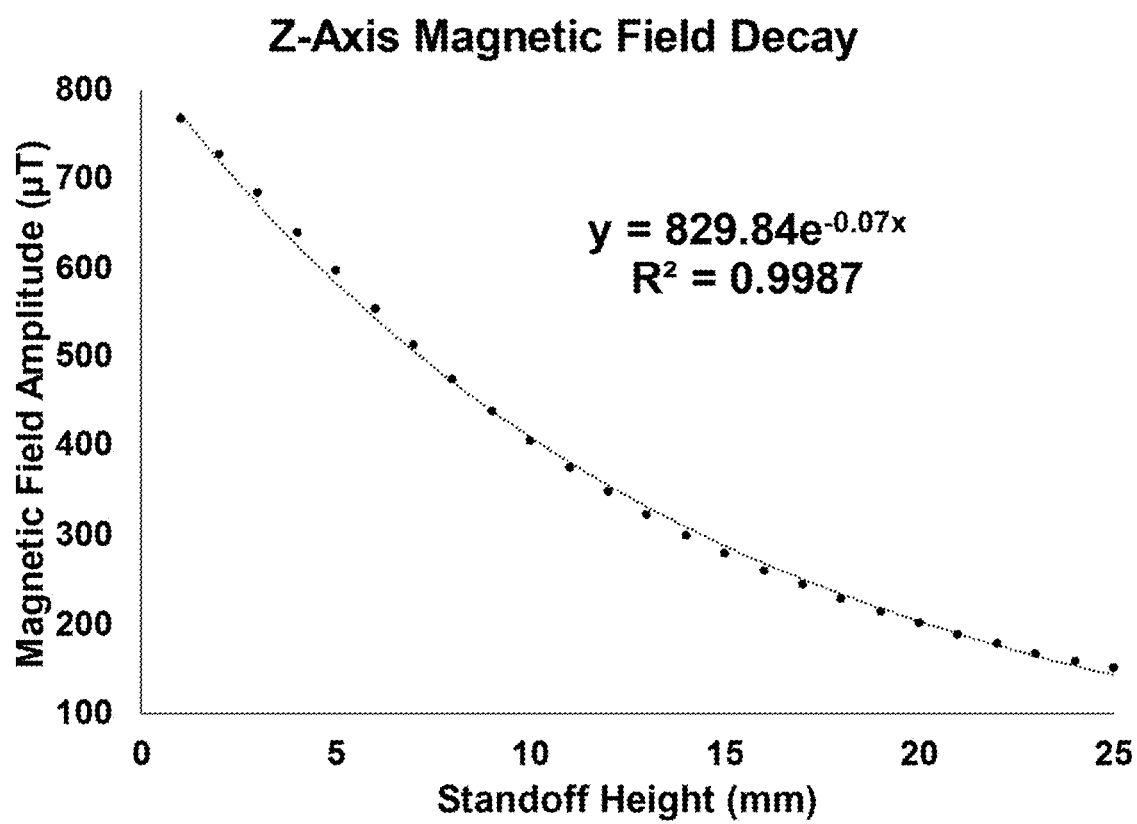
FIG. 13 A scatter plot showing the fitted exponential decay of a LiB's magnetic field measured via a chip magnetometer at 82.2% state-of charge. Data was taken at the 100 mm spatial position (middle battery) from FIG. 3. This decay curve shows that even at 25 mm standoff, the magnetic signature is still 5-10× larger than Earth's magnetic field.

The intensity of a magnetic field decays exponentially as a function of distance from the source. To show that we can effectively measure the magnetic field amplitudes using the lower sensitivity chip magnetometers in a real-world application, we increased the standoff distance (height from battery top to magnetometer active sensing region) from 1 mm to 25 mm away, in 1 mm increments. Three selected heights are shown for the X, Y, and Z magnetic field axes in FIG. 12. The Z-axis magnetic field amplitudes (y), at 100 mm spatial position (center of defective battery), are plotted as a function of height (x) and the exponential fit was extracted as the following equation, $y=829.84e^{-0.07x}$, with a regression coefficient of $R2=0.9987$ (FIG. 13). The magnetometer used for this preliminary study has an output RMS noise of 0.3 µT under high accuracy preset, and a resolution of 0.3 µT. Using 3× the noise threshold, as is standard to define the limit-of-detection (LOD), and the resolution as the error, we obtain 0.9 µT+0.3 µT=1.2 µT as our estimated LOD. In terms of standoff, this corresponds to a ~93 mm (3.66") height that the sensor could be placed at and still accurately identify individual defective LiBs in an array based on their Z-axis magnetic field amplitude. Although this is estimated for the highest signal (defective battery), it is anticipated that SOC measurements will be feasible when the sensor is within ~1" away. This is more than enough distance to be applicable for LiBs in shipment packages and electric vehicle battery packs, since the distance from the container walls to the LiBs is typically less than 1" thick.

Figure 15:
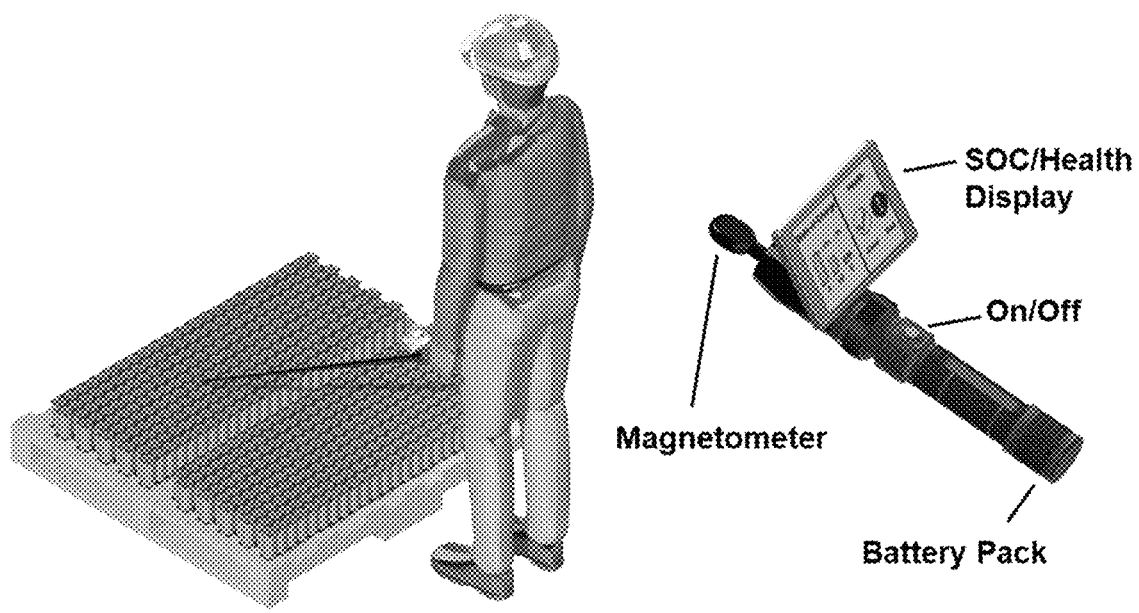
FIG. 15 Schematic of the proposed form factor for non-contact state-of-charge and health determination via in-field portable magnetometry. This form factor is designed with an extendable magnetometer mount (magnetometer is interchangeable for selection based on desired sensitivity) that can also bend at the tip to fit in a variety of confined locations, while allowing the user to monitor LIB packs from a safe distance.

The relatively high magnetic field amplitudes allow a chip magnetometer to be scanned ~1" above a LiB pack's surface (characteristic of a LiB package's wall thickness or the housing of an automobile's battery pack) and still accurately monitor the state-of-charge and health. If higher sensitivity is needed (e.g. thicker shipment packaging or automotive components in the way after a vehicle accident for an electric battery pack), then a more sensitive magnetometer can be chosen (FIG. 9 for down selection), such as an atomic magnetometer (e.g. OPM). The prototype form factor is shown in FIG. 15 and consists of an integrated battery pack and state-of-charge/health display in the handle with an extendable wand that is also flexible at the tip for probing hard to reach areas (e.g. reaching into a shipping crate or an overturned electric vehicle) while still keeping the operator at a safe distance. The sensor housing allows for mounting the "right" magnetometer selected for the "right" application (based on the sensitivity needed) and is easily interchangeable.

Example 7. QA/QC and Health Monitoring of Manufactured Materials Used in the Production of LiBs In a LiB manufacturing environment, there are multiple individual components that come together to form the entire battery, each with their own magnetic signature amplitude. These magnetic signatures at the materials-level (i.e. electrode thin films) are significantly lower (~100-1000×) than those measured on fully assembled cells. Therefore, a high sensitivity magnetometer, such as the optically pumped magnetometer (OPM) must be selected (see FIG. 9 for down selection).

Figure 16:
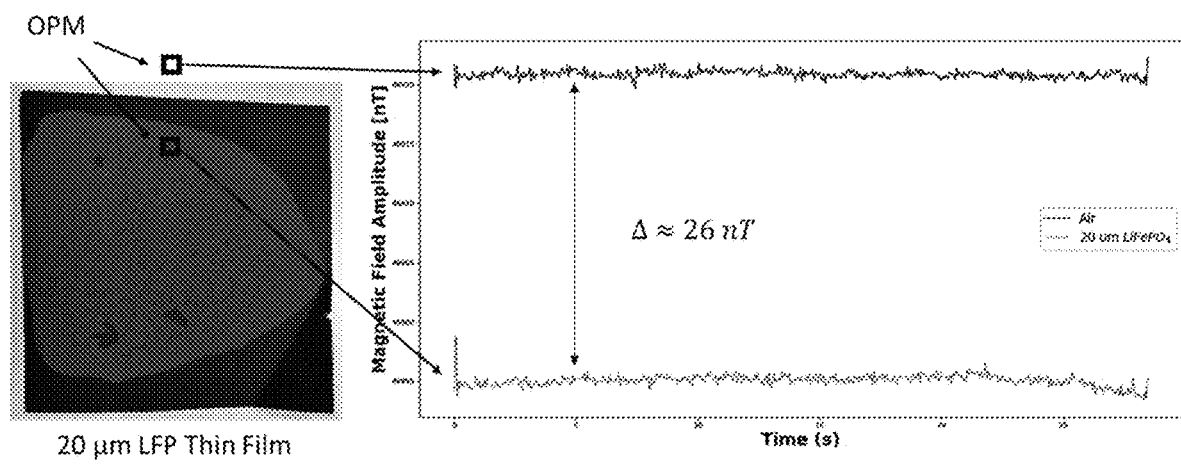
FIG. 16 Picture of a $LiFePO_4$ (LFP) thin film layer that is ~20 μm thick with black squares defining the two measurement locations of the OPM (air and over top of the LFP thin film), with the corresponding magnetic signatures. The change observed from the LiB cathode material thin film is ~26 nT.

A total-field OPM was mounted in a fixed location above the sample, with a slot underneath that allows the sample itself to be manually moved in and out of the magnetometer's detection region. This OPM requires locking onto Earth's magnetic field for function and after a stabilized lock is achieved, magnetic field amplitudes can be measured. The OPM was positioned as close as possible to the thin film without perturbing the surface when moved into the detection area. The magnetic signature of a ~20 µm thick cast film of LiFePO$_4$ (LFP) in an unlithiated state was measured using the OPM and the resulting magnetic field amplitude (with Earth's magnetic field as a reference) are plotted in FIG. 16.

The traces shown here have a band reject filter applied from 58-62 Hz and then a $7^{th}$-order Butterworth lowpass filter applied at 0.1× the sampling frequency. Earth's magnetic field (i.e. when the sample was not in the detection area, denoted as "Air") has a amplitude of 46,921.87±0.29 nT while the LFP cast film shows a decrease of ~26 nT to 46,895.02±0.43 nT. This shows that the magnetic field amplitudes of LFP cast films for LiBs is within the sensitivity afforded by the OPM.

Figure 9:
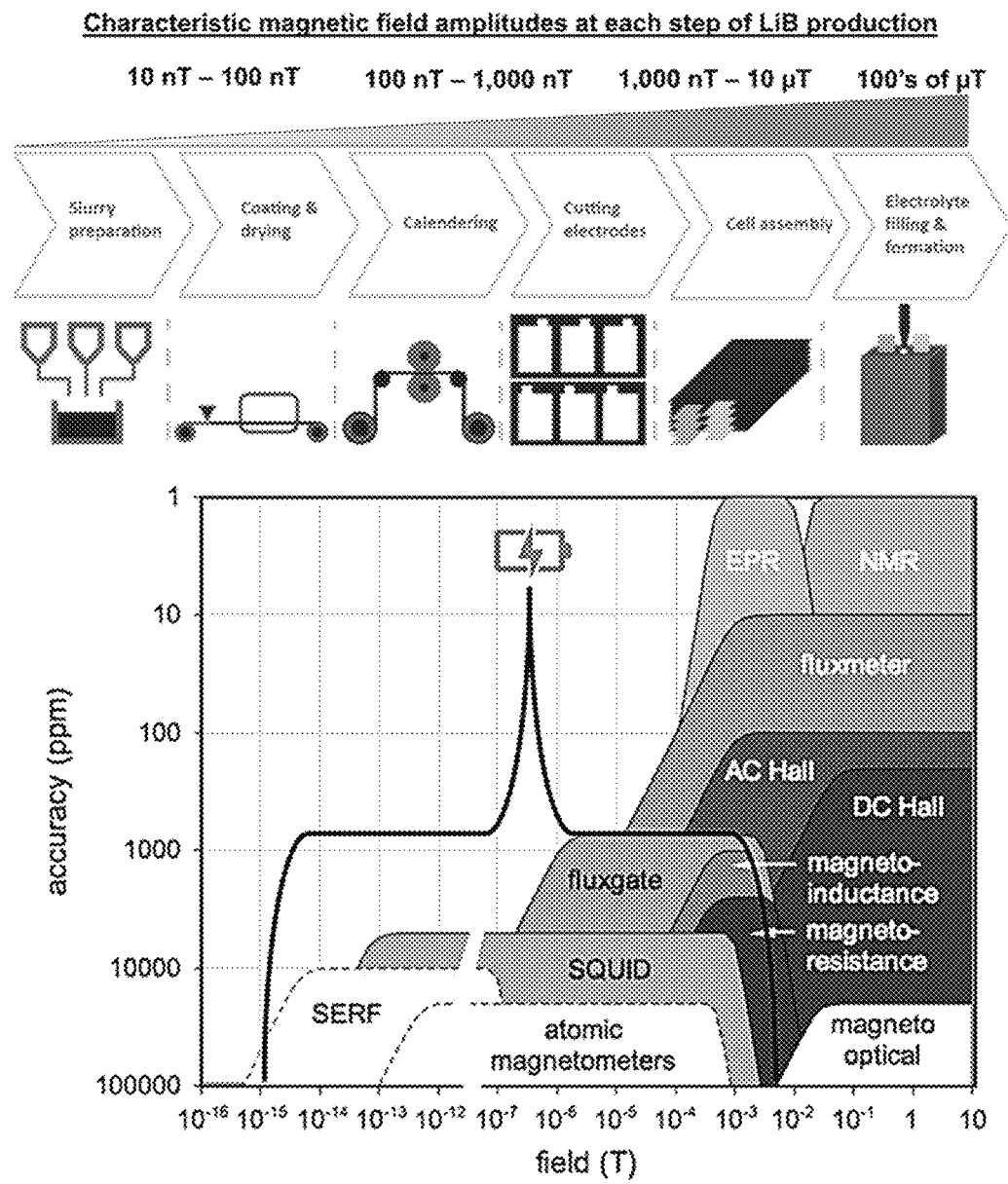
Figure 17:
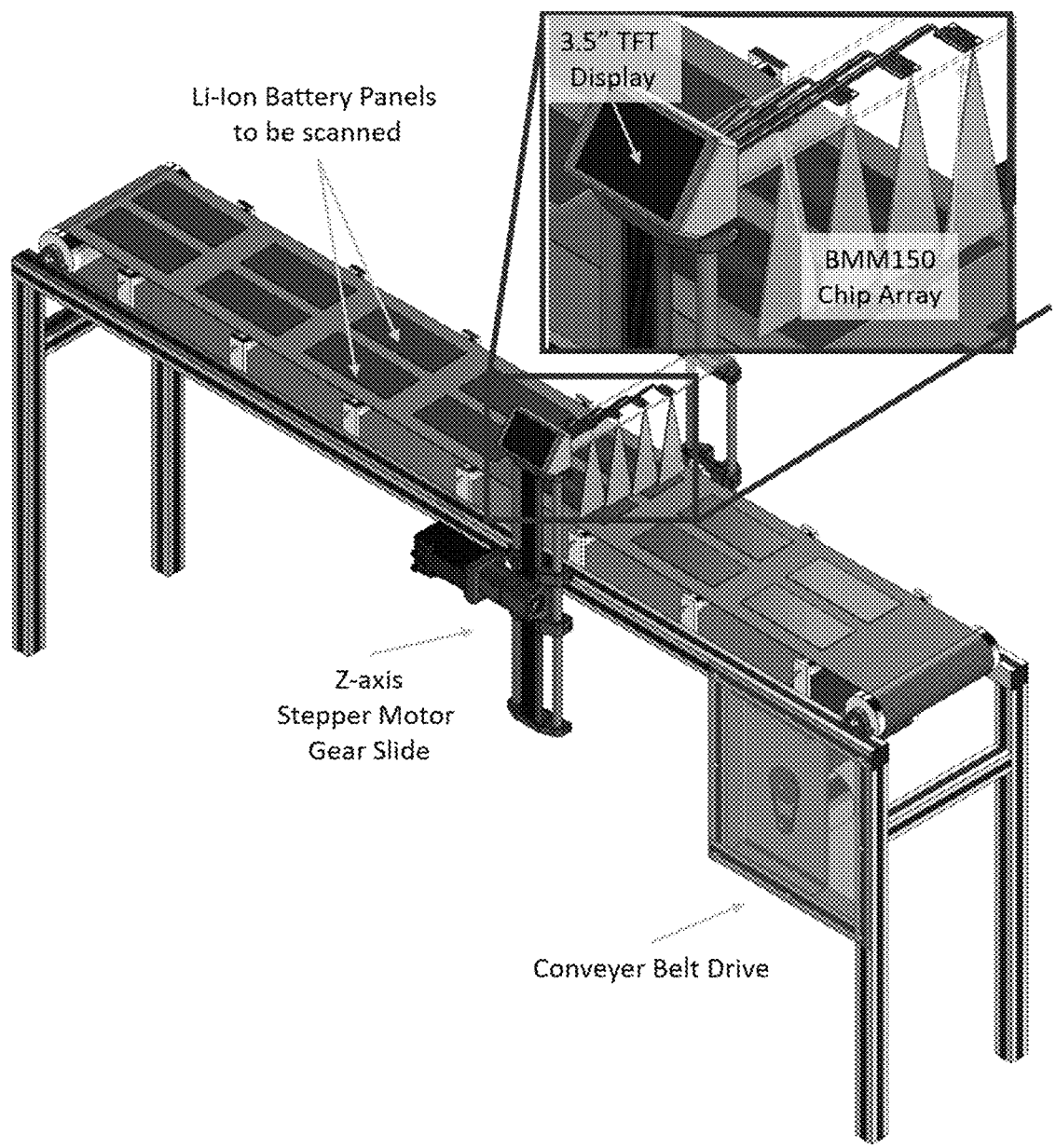
FIG. 17 A schematic of the proposed form factor for non-contact QA/QC of LiBs on the manufacturing line. This form factor includes a conveyer belt with a belt drive where the LiB component of interest to be scanned (e.g. cathode thin film) is located. The conveyer belt guides the sample under an array of magnetometers (selected based on the sensitivity needed for each component) where a z-axis stepper motor can control the standoff height. An integrated display shows whether the component under test has passed or failed the QA/QC.

A proposed form factor for non-contact QA/QC and health monitoring of LiB materials on the manufacturing line is shown in FIG. 17. This form factor includes a conveyer belt with a belt drive where the LiB component of interest to be scanned (e.g. cathode thin film) is located. The conveyer belt guides the sample under an array of selected magnetometers (interchangeable for desired sensitivity) where a z-axis stepper motor can control the standoff height. An integrated display shows whether the component under test has passed or failed the QA/QC and whether any identified defects are present. This technique is also directly applicable to the inspection of fully assembled LiBs, at the end of the manufacturing process, which are known to have much higher magnetic field strengths than the individual material themselves. As previously mentioned, the magnetometers are interchangeable and thus can be selected based on the desired sensitivity (FIG. 9)

What is claimed is:

1. A method for non-invasive characterization of an electrical charge storage device containing lithium ions or lithium metal, the method comprising:
   a) providing at least one electrical charge storage device having a cathode material;
   b) measuring a magnetic field characteristic of the cathode material using at least one magnetic field sensor positioned in electromagnetic communication to the electrical charge storage device;
   c) acquiring magnetic field data; and,
   d) determining the condition of the at least one electrical charge storage device using the magnetic field data;
   wherein, the electrical charge storage device does not require a complete circuit or a functional cell for determining the condition of the at least one electrical charge storage device.

2. The method of claim 1, wherein the measuring a magnetic field generated by the at least one electrical charge storage device does not require magnetic shielding from external magnetic fields.

3. The method of claim 2, wherein the measuring a magnetic field generated by the at least one electrical charge storage device does not require magnetic shielding from Earth's magnetic field.

4. The method of claim 2, wherein the measuring a magnetic field generated by the at least one electrical charge storage device occurs while the at least one electrical charge storage device is in an open circuit configuration.

5. The method of claim 4, wherein the at least one electrical charge storage device is a multi-battery pack in an open circuit configuration.

6. The method of claim 2, wherein the measuring a magnetic field generated by the at least one electrical charge storage device occurs while the at least one electrical charge storage device is in a closed circuit configuration.

7. The method of claim 6, wherein the at least one electrical charge storage device is a multi-battery pack in a closed circuit configuration.

8. The method of claim 1 wherein the at least one electrical charge storage device is at least two electrical charge storage devices.

9. The method of claim 1, wherein the determining the condition of the at least one electrical charge storage device using the magnetic field data comprises determining a state-of-charge or a state-of-health of the at least one electrical charge storage device.

10. The method of claim 1, wherein the at least one electrical charge storage device comprises a lithium battery with an anode comprising a paramagnetic or a ferromagnetic material.

11. The method of claim 10, wherein the paramagnetic or the ferromagnetic material comprises lithium.

12. The method of claim 1, wherein the at least one electrical charge storage device comprises a lithium battery with a cathode comprising a paramagnetic or ferromagnetic material.

13. The method of claim 12, wherein the paramagnetic or the ferromagnetic material comprises nickel.

14. The method of claim 1, wherein the determining the condition of the at least one electrical charge storage device using the magnetic field data compromises evaluating growth of a solid electrolyte interface.

15. The method of claim 1, wherein the determining the condition of the at least one electrical charge storage device using the magnetic field data comprises detecting a defect within the at least one electrical charge storage device.

16. The method of claim 1, wherein the determining the condition of the at least one electrical charge storage device using the magnetic field data compromises detecting inhomogeneities within the at least one electrical charge storage device introduced during manufacture.

17. The method of claim 1 further comprising, repeating the steps of measuring, acquiring and determining on the same electrical charge storage device one or more times after a period of use.

18. The method of claim 17, wherein the period of use is at least 3 hours.

19. The method as in claim 1, wherein the electrical charge storage device is in a state of full charge or a state of partial charge, and wherein a state of partial charge is between 0% and 90% of a state of full charge, and wherein the method is performed before an external electrical load has been placed across the terminals of the electrical charge storage device.

20. The method of claim 1, wherein the measuring a magnetic field is accomplished using a sensor, wherein the sensor is selected from the group consisting of an optically pumped magnetometer, a Hall probe, fluxgates, a magneto-resistive sensor, and a magneto-electric sensor.

* * * * *